(12) United States Patent
Schwarte

(10) Patent No.: US 6,927,889 B2
(45) Date of Patent: Aug. 9, 2005

(54) PROCESS AND DEVICE FOR DETECTING AND PROCESSING SIGNAL WAVES

(76) Inventor: Rudolf Schwarte, Kreuztaler Strasse 56, 57250 Netphen (DE)

( * ) Notice: Subject to any disclaimer, the term of this patent is extended or adjusted under 35 U.S.C. 154(b) by 295 days.

(21) Appl. No.: 10/399,454

(22) PCT Filed: Oct. 16, 2001

(86) PCT No.: PCT/DE01/03914
§ 371 (c)(1),
(2), (4) Date: Apr. 15, 2003

(87) PCT Pub. No.: WO02/33922
PCT Pub. Date: Apr. 25, 2002

(65) Prior Publication Data
US 2004/0012834 A1 Jan. 22, 2004

(30) Foreign Application Priority Data
Oct. 16, 2000 (WO) .............................. PCT/DE00/03632

(51) Int. Cl.$^7$ .............................. G02F 1/00; H03D 3/00; H01L 31/00
(52) U.S. Cl. ........................................ 359/237; 359/325
(58) Field of Search ................................ 354/237, 238, 354/254, 325; 250/214 R; 257/222, 431, 444

(56) References Cited
U.S. PATENT DOCUMENTS
6,825,455 B1 * 11/2004 Schwarte .................. 250/214.1

OTHER PUBLICATIONS

Schwarte et al, "A New Electrooptical Mixing and Correlating Sensor: Facilities an Applications of the Photonic Mixer Device",SPIE, vol. 3100, Jan. 1997.*

* cited by examiner

Primary Examiner—Scott J. Sugarman
Assistant Examiner—Richard Hanig
(74) Attorney, Agent, or Firm—Paul & Paul

(57) ABSTRACT

The invention relates to a method for the recording and processing of the amplitude and phase of signal waves, whereby a signal source generates a modulated signal wave, which is altered on the way thereof through a transmission medium or through an object as a result of reflection and/or dispersion, received by a receiving device and directly demodulated therein, using a modulation signal which has a well-defined relationship to the modulation of the signal waves, by means of a modulation device without the signal wave carrier and recorded and analysed in relation to the amplitude of the modulated signal wave and phase relationship of the modulation pahse of the signal wave and of the modulation signal. In a sensor, sensitive to the signal waves, in a receiver device, wave energy particles, directly or indirectly generated by means of the signal wave energy in a wagging process, with a wave energy wag matching the modulation signal, are fed to at least two distinguishable groups of receiving elements on the sensor, recorded, optionally amplified and transmitted by at least one read-out output of an output unit, corresponding to at least one of the group of distinguishable receiving elements, in the form of a sum and/or correlation signal.

31 Claims, 9 Drawing Sheets

PROCESS AND DEVICE FOR DETECTING AND PROCESSING SIGNAL WAVES

Figures 1, 1A:
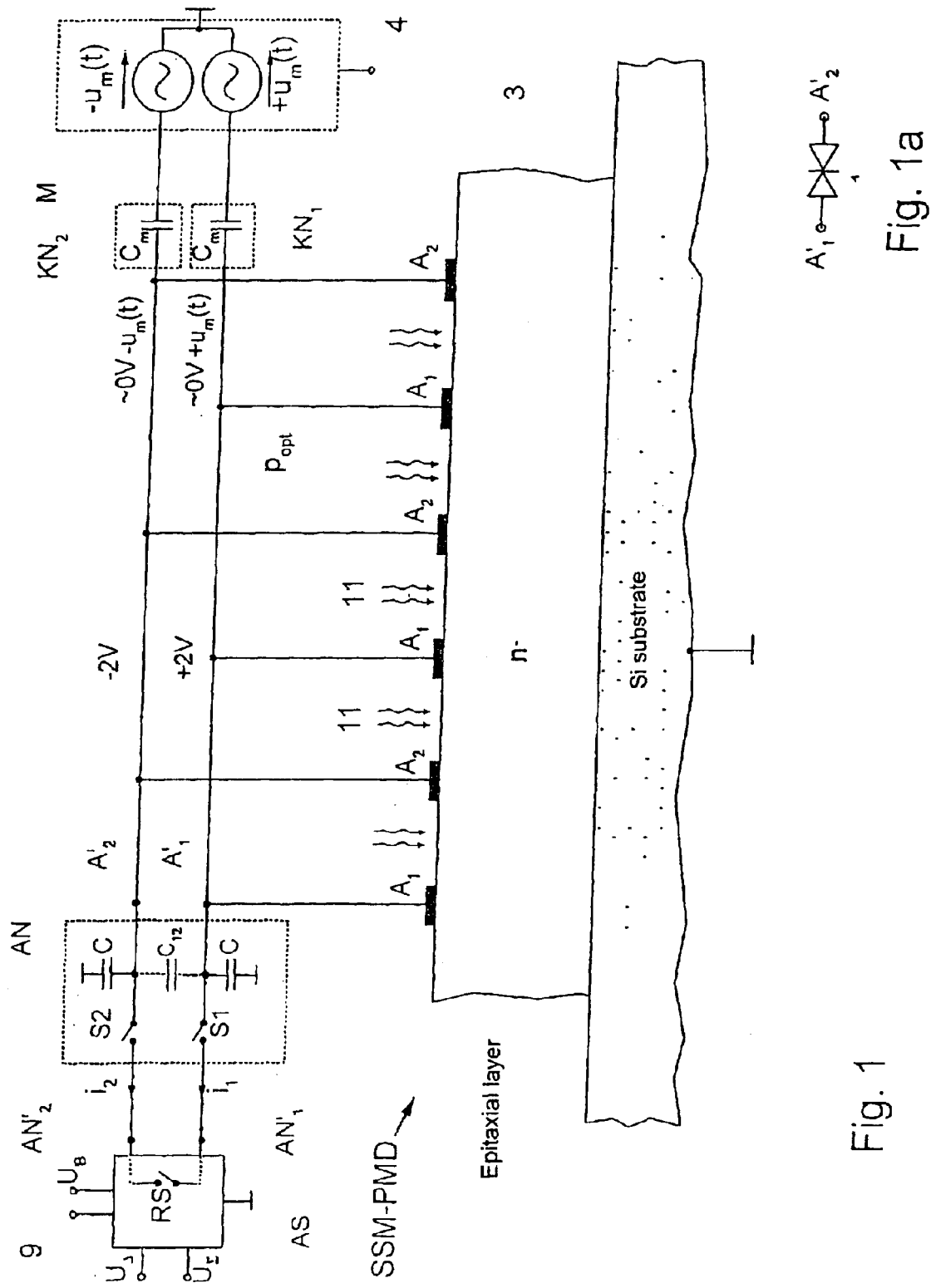

The present invention relates to a process for detecting and processing the amplitude and phase of signal waves, wherein a signal source generates a modulated signal wave which is modified in its path through a transmission medium or object, due to reflection and/or scattering, received by a receiving apparatus and there directly demodulated with a modulation signal, which has a well-defined relationship to the modulation of the signal wave, by means of a modulation device (PMD, MMD) without the signal wave carrier, and is detected and evaluated with respect to the amplitude of the modulated signal wave and the phase relationship of the modulation phase of the signal wave and of the modulation signal, wherein in a sensor in a receiving apparatus, sensitive to the signal wave, wave energy particles directly or indirectly generated by means of the signal wave energy, in an oscillation process with a wave energy oscillator matching the modulation signal, are fed to at least two distinguishable groups of receiving elements on the sensor, detected, optionally amplified, and transmitted by at least one read-out output from a readout unit corresponding to the groups of receiving elements in the form of a summation and/or correlation signal.

The present invention equally relates to a device for detecting and processing the amplitude and phase of signal waves, with a signal source which generates a modulated signal wave, a receiving apparatus for the signal wave, modified in its path through a transmission medium and/or an object due to reflection and/or scattering, a modulation device of the receiving apparatus, which is loaded with a modulation signal, which has a well-defined relationship to the modulation of the signal wave, a sensor, in the receiving apparatus, sensitive to the signal waves, in which wave energy particles are directly or indirectly generated by the signal wave energy, wherein the modulation device is designed to feed the wave energy particles in an oscillation process with a wave energy oscillator matching the modulation signal to at least two groups of receiving elements of the sensor and with at least one corresponding readout output of a readout unit, for the emission of a summation and/or correlation signal.

A corresponding process and a corresponding device are known from DE 196 35 932.5. The photocharges generated in the PMD by the incident modulated light wave are, according to this state of the art, exposed to a demodulating oscillation process by means of at least two photogates and read out and evaluated in the push-pull, reducing the expenditure on, and size of the receiver compared with previously known devices of similar effect by orders of magnitude, which makes possible the construction of an array producing 3D images from many pixel-type receivers. In spite of this exceptional progress, such PMD pixel receivers have possibilities for improvement.

An important technical task in industrial production and automation, in road traffic, in safety engineering and many additional fields, consists of obtaining, via the propagation of signal waves, i.e. contact-less by means of wave propagation, information about transmitted and reflected signal waves. Measuring systems for such tasks have long been known, in particular laser radars for optical signal waves, microwave radars for microwaves and computer tomographs for X-rays. For self-generated signal waves, the signal source is modulated in a suitable manner. By suitable demodulation of the transmitted and reflected signal waves, object information can be obtained. The associated receiving apparatus is very expensive and generally only contains one receiver. However in order to measure many measuring points on the signal wave, it uses a scanner. The state of the art for optical signal waves is described e.g. in "Computer Vision" Vol. 1, Academic Press, ISBN-o-12-379771-3 on pages 474 ff. This describes a novel solution for simplification of the phase/duration measurement of one optical receiver, the "Photonic Mixer Device" (PMD), which is described for the first time in the abovementioned DE 196 35 932.5.

The photogates necessary for the inherent modulation of the PMD cause an attenuation of the incident light. Moreover, the modulating electrical drift field is not optimally introduced into the flow direction of the photocharge. The modulation bandwidth of the modulation of the photocurrent distribution by means of this modulation photogate is practically limited to approximately 1 GHz.

Novel solutions are sought for photonic mixer devices without modulation photogates with, in particular, higher modulation bandwidths, higher accuracy and higher sensitivity.

The object of this invention is to provide a process and a device of the type mentioned at the outset, which use novel advantageous PMD receiver principles for the signal waves listed, and to propose PMD sensors with improved properties, extended areas of use and novel performance features.

The sought two-dimensional detector for electromagnetic waves should be capable, with the highest possible time-resolution and bandwidth, of detecting coded/modulated signal waves in their phase and amplitude. It should at the same time avoid the detector properties being adversely affected by the modulator signal itself and constructive disadvantages connected therewith. It should inherently demodulate, decode and optionally correlate, with simultaneously high conversion conductance and high bandwidth and sensitivity. The correlated signal wave proportion of the received signal wave should be fairly low-noise and be determined with high selectivity, whilst the non-correlated signal wave proportion, e.g. background radiation is to be suppressed so far as possible.

To achieve the object with respect to the process, it is proposed that at least one of the groups of receiving elements is directly loaded with the modulation signal.

With respect to the device, the object of the invention is achieved in that at least one of the groups of receiving elements is directly connected with the modulation device.

The detector is expediently divided into a number of cooperating detector strips (receiving elements), which form a "finger structure", wherein the introduction of the modulation signal required for the mixing does not take place through an additional modulating finger structure, but wherein the receiving elements themselves serve to introduce the at least one modulation signal. In particular in the case of photodetectors, the realization in a finger structure is a particularly effective measure to achieve a high switching speed by short photocharge paths, and for the required pixel-size flexibility.

With microwave signals also, due to the very short wavelength, a number of receiving elements is necessary, in order to obtain a sufficiently large cross-section surface with correspondingly high reception performance. This purpose is in general served by rectangular/finger-shaped patch antennae, which due to the alignment according to the polarization of the signal waves, form a finger structure.

As signal waves, not only are electromagnetic waves of the whole practically-available spectrum from the radio range to far ultraviolet, and in the case of suitable detectors also X or gamma radiation taken into consideration, but also for example acoustic waves, in particular ultrasonic waves.

The "wave energy particles" are in general electrodes and/or holes. They can be generated directly, for example as photoelectrons by radiation impinging on a photosensitive semiconductor material or indirectly by charge transfer in antennae, e.g. by microwaves, or in piezoelectric materials by electroacoustic interaction.

Receiving elements are correspondingly elements/terminals of capacitors and/or diodes which corresponding to the charge generation and/or transfer, detect the resultant charge carriers, which are registered either as charge quantity or as corresponding current. The arrangement, switch and modulation of the at least one group of receiving elements takes place in such a way that all the wave energy particles generated on the basis of signal waves which are non-modulated, and non-correlated for modulation of the receiving element, during integration of the measurement signal, make no contribution to the measurement signal, so that the modulated signal proportion contributes almost exclusively to the measurement result.

The groups of receiving elements consist of at least one receiving element each, but have preferably in each case a number of receiving elements.

While the detector electrodes in the known PMD normally only serve for the readout of the detected signal, according to the present invention there is a "self-modulation" (SM) of the detector and thus a "self-modulation PMD" (SM-PMD). To carry out this self modulation two paths are proposed, which are advantageous depending on the type of detector and measurement task.

In the case of the symmetrical SM-PMD (SSM-PMD), as represented in FIG. 1 using the example of an SM-PMD in Schottky/MSM (Metal Semiconductor Metal) technology, the two types of electrode multiply switched in parallel, e.g. anode or cathode, are steered into a symmetrical arrangement preferably via capacitances Cm of the coupling network KN1 and KN2 with a push-pull modulation signal ±um(t) of the modulation source M and read out via a scanning readout network.

Figure 2:
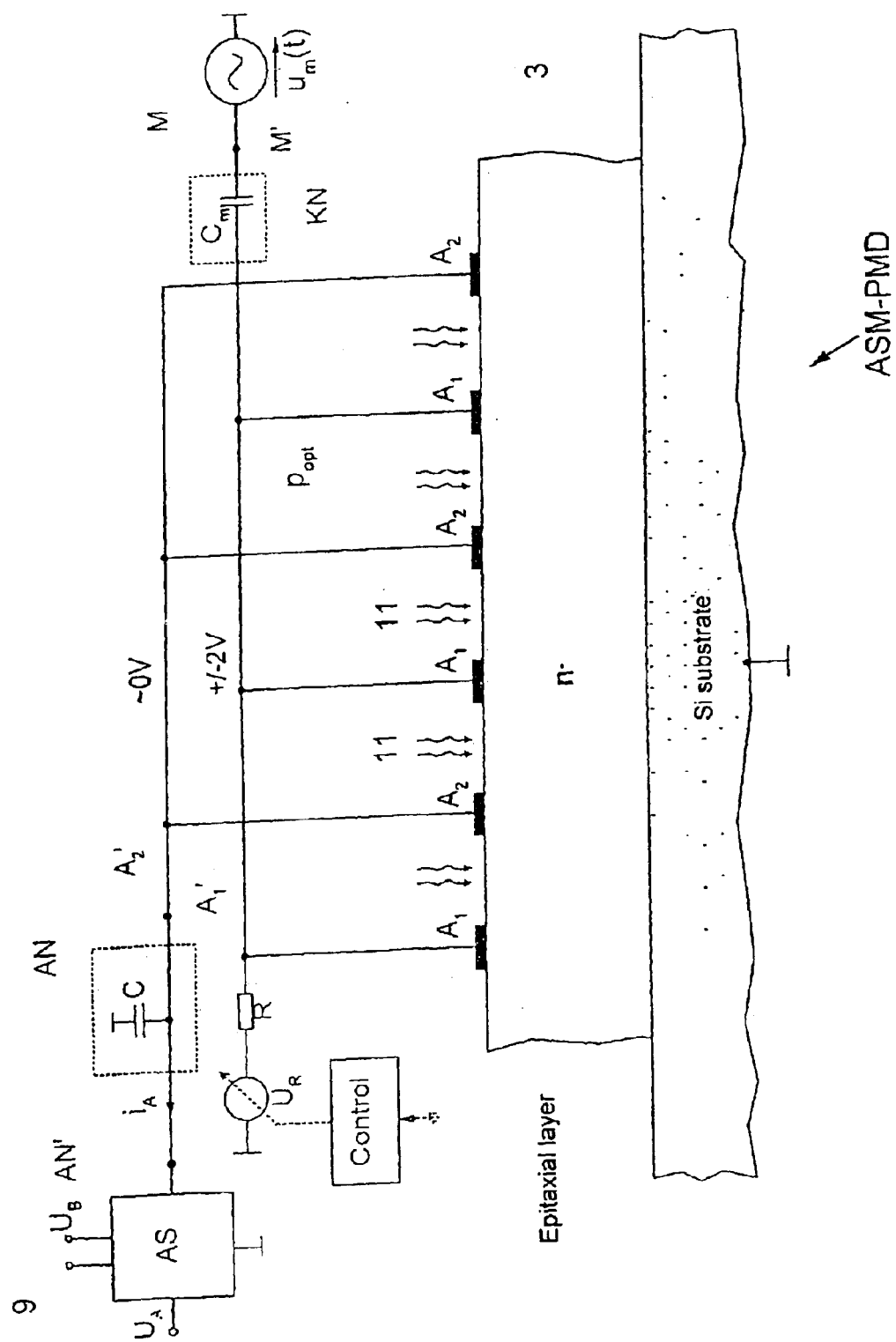

In the case of the asymmetrical SM-PMD (ASM-PMD) the one type of electrode e.g. A1 in FIG. 2 is actively modulated on one side only, while the other type of electrode A2 which is opposite in each case is only passively involved in the mixing process via a low-resistance readout network AN in connection with the evaluation circuit AS, which at the same time means that the charges resulting from the mixing process can be read out largely undisturbed by the modulation signal.

Figure 3:
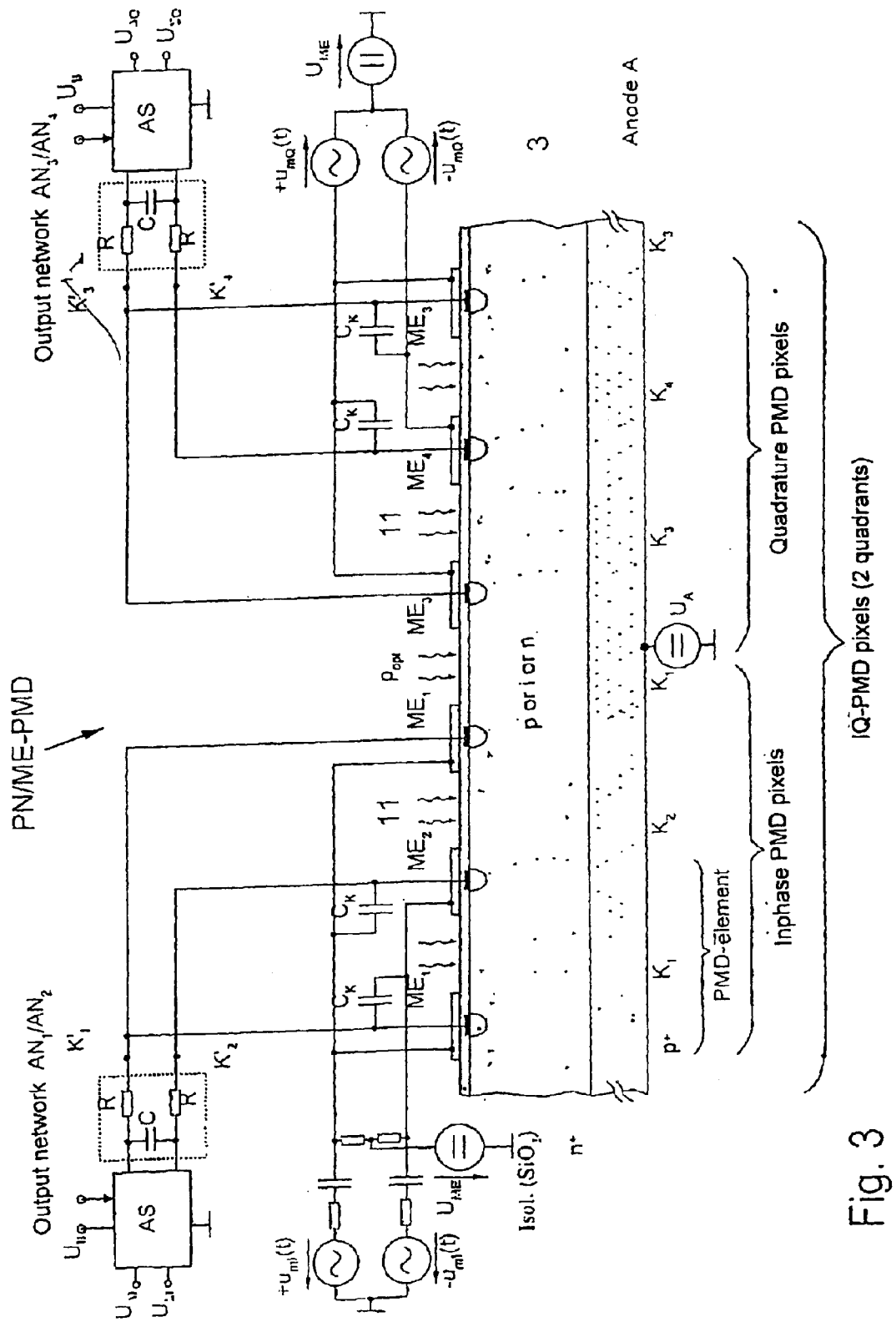

Further advantages, features and possible applications of the present invention are made clear on the basis of the following description of a preferred version and the associated figures. These show:

FIG. 1 a section through a part of a planar photonic mixer device PMD according to the invention, with symmetrical self-modulation and readout (SSM-PMD) in Schottky diode technology as a finger structure with scanning readout network FIG. 2 a section through a part of a planar photonic mixer device PMD according to the invention, in Schottky technology with asymmetrical self-modulation and readout (ASM-PMD) in Schottky diode technology as a finger structure FIG. 3 a section through a part of a planar photonic mixer device according to the invention, of symmetrical self-modulation in PN technology with cathode readout of the photoelectrons and with additional modulation of the shielding electrode ME as shield for the readout diodes, carried out in a 2-phase mixture (0, 90°/I/Q)

Figure 4:
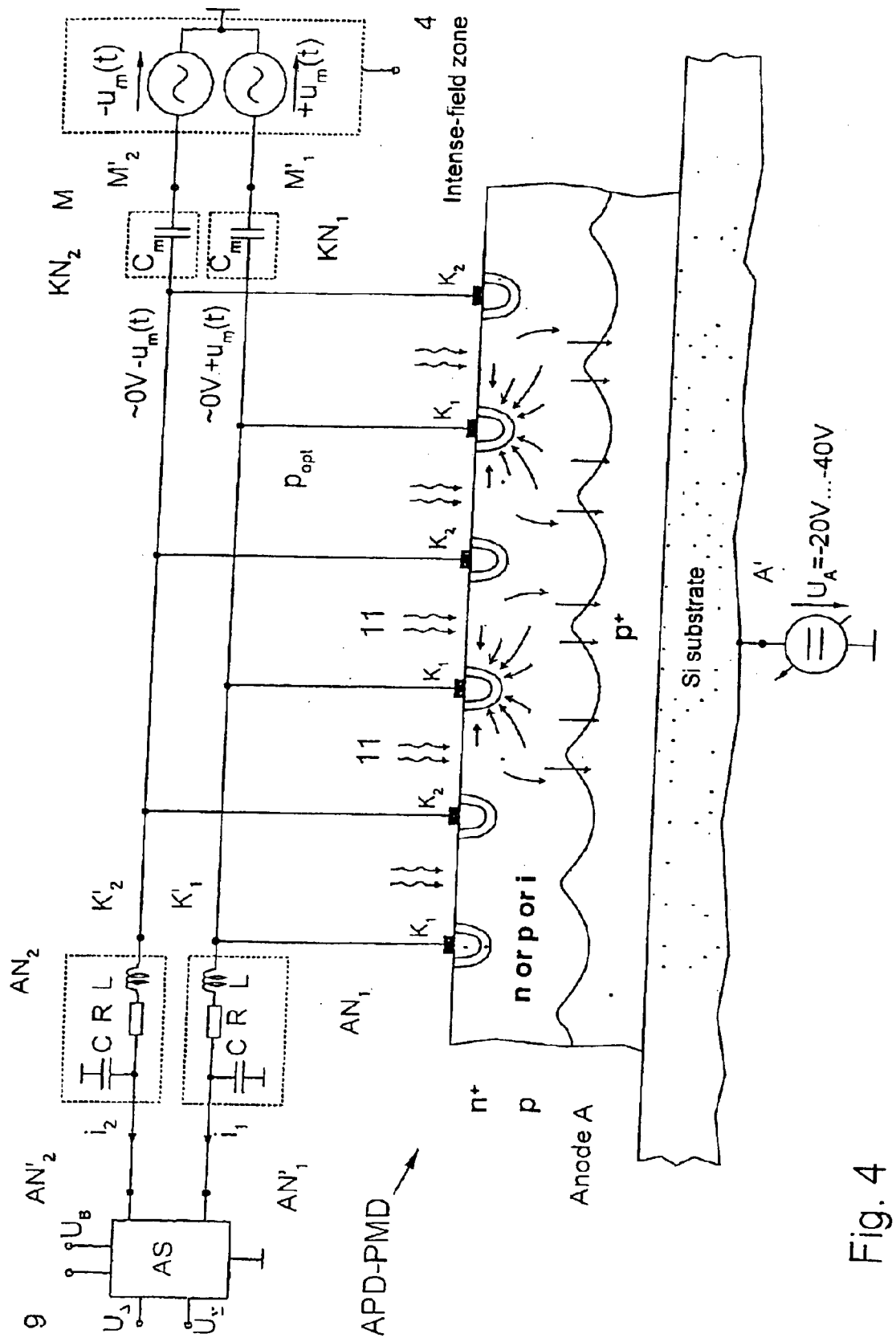
Figure 5:
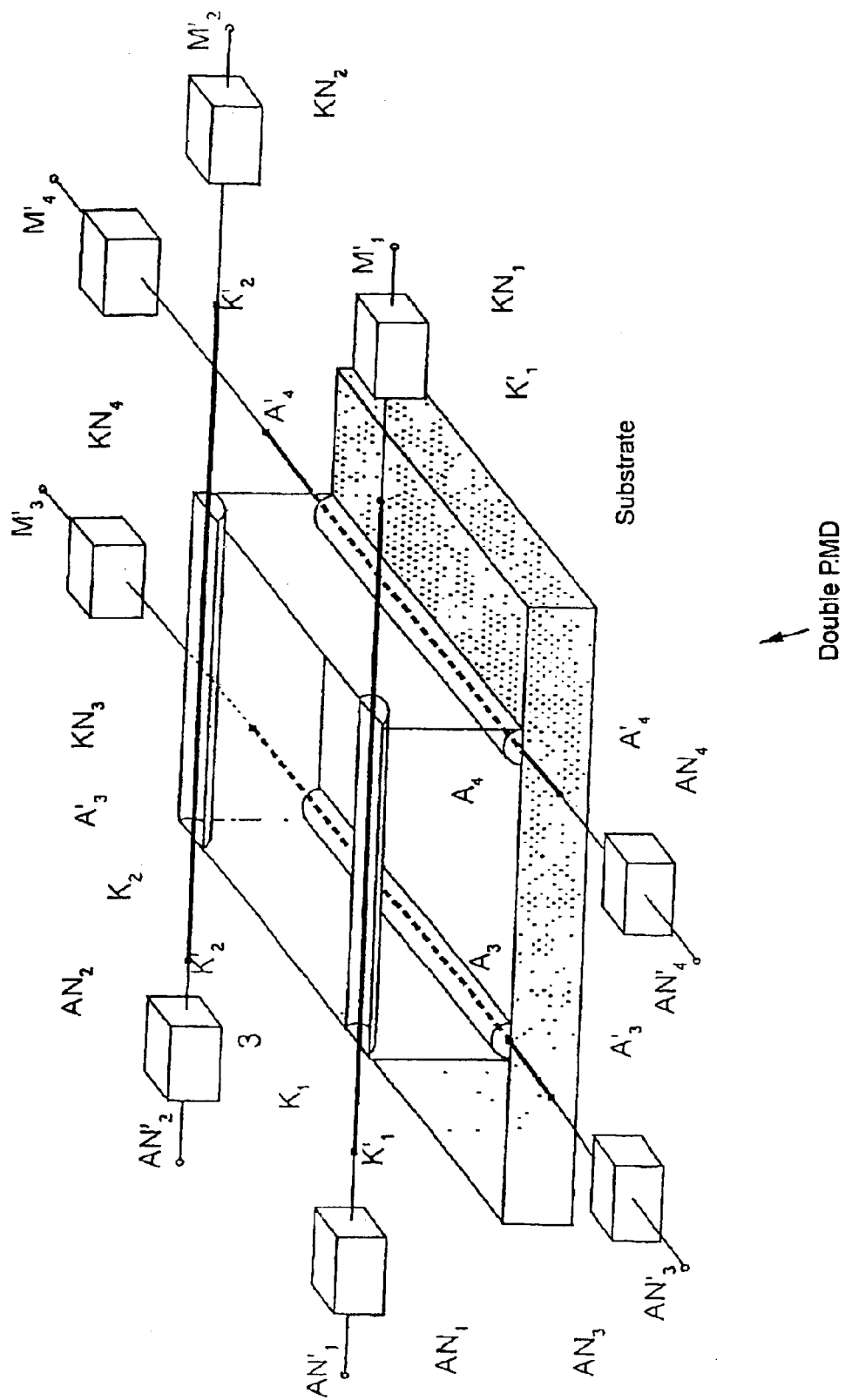

FIG. 4 a planar avalanche photonic mixer device (APD-PMD) represented in cross-section of strip-shaped or hemispherical readout diodes with an avalanche-effect intense-field zone, operated in symmetrical self-modulation mode FIG. 5 a two-sided orthogonal strip structure for 4-phase PMD operation as "double PMD"

Figure 6:
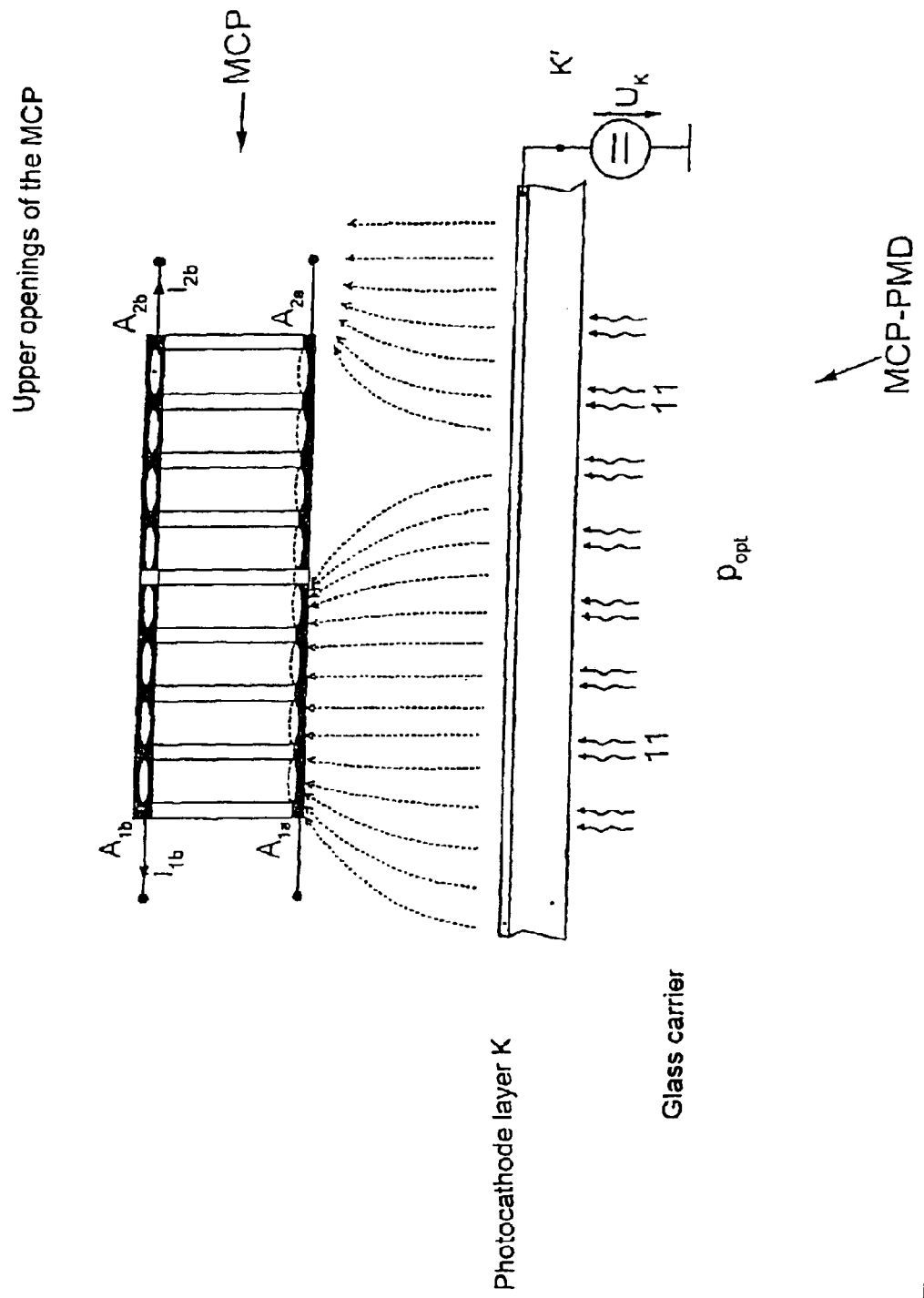
Figure 7:
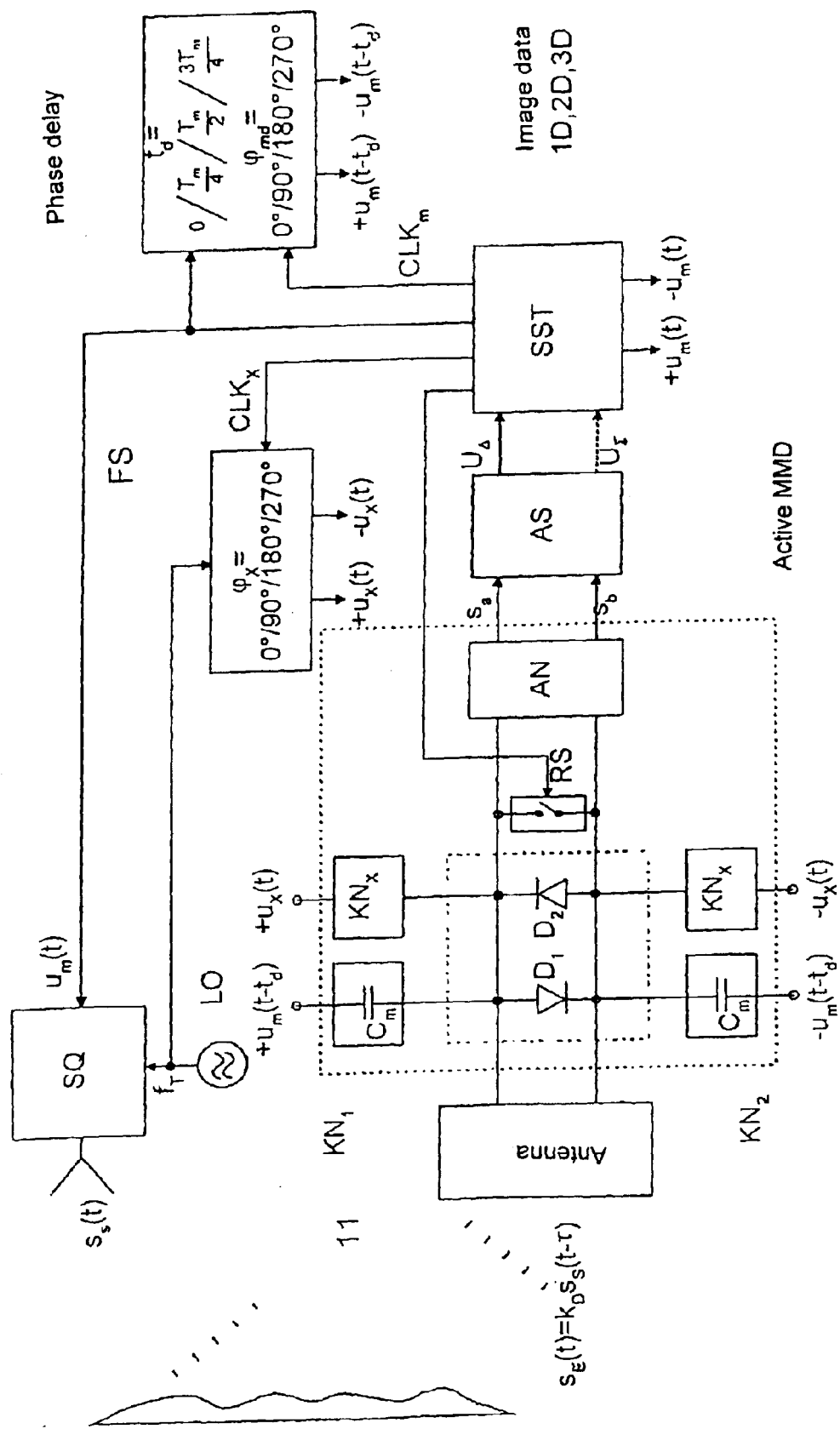

FIG. 6 an MCP-PMD, a vacuum PMD, with downstream microchannel plate amplification FIG. 7 a block diagram of a microwave mixer detector (MMD) with a modulated antiparallel Schottky diode pair as charge oscillator and with symmetrical self-modulation and additional mixing amplification (active MMD)

Figure 8:
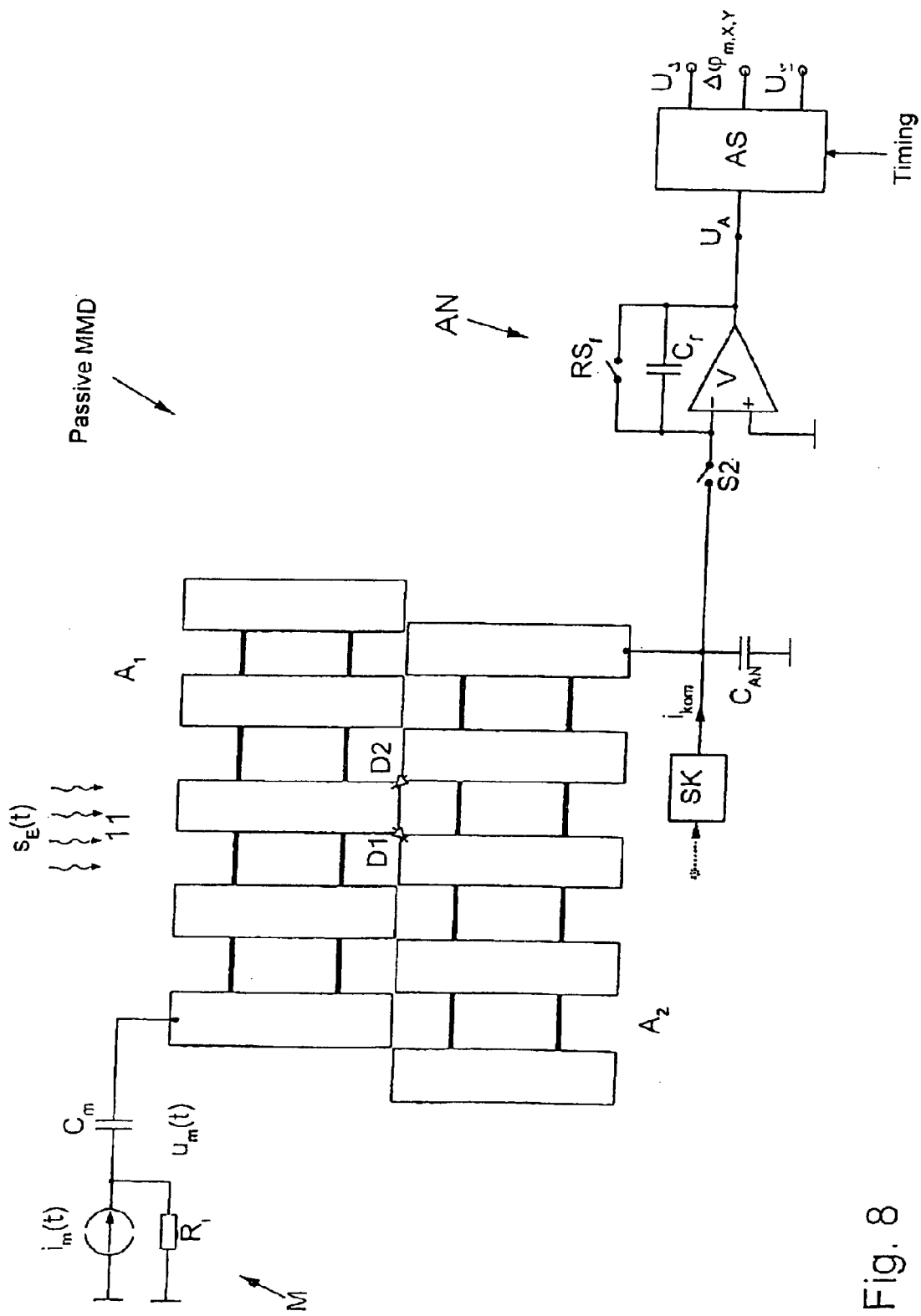

FIG. 8 a version of the MMD without mixing amplification with an asymmetrically modulated and read-out patch antenna structure (passive MMD)

Figure 9:
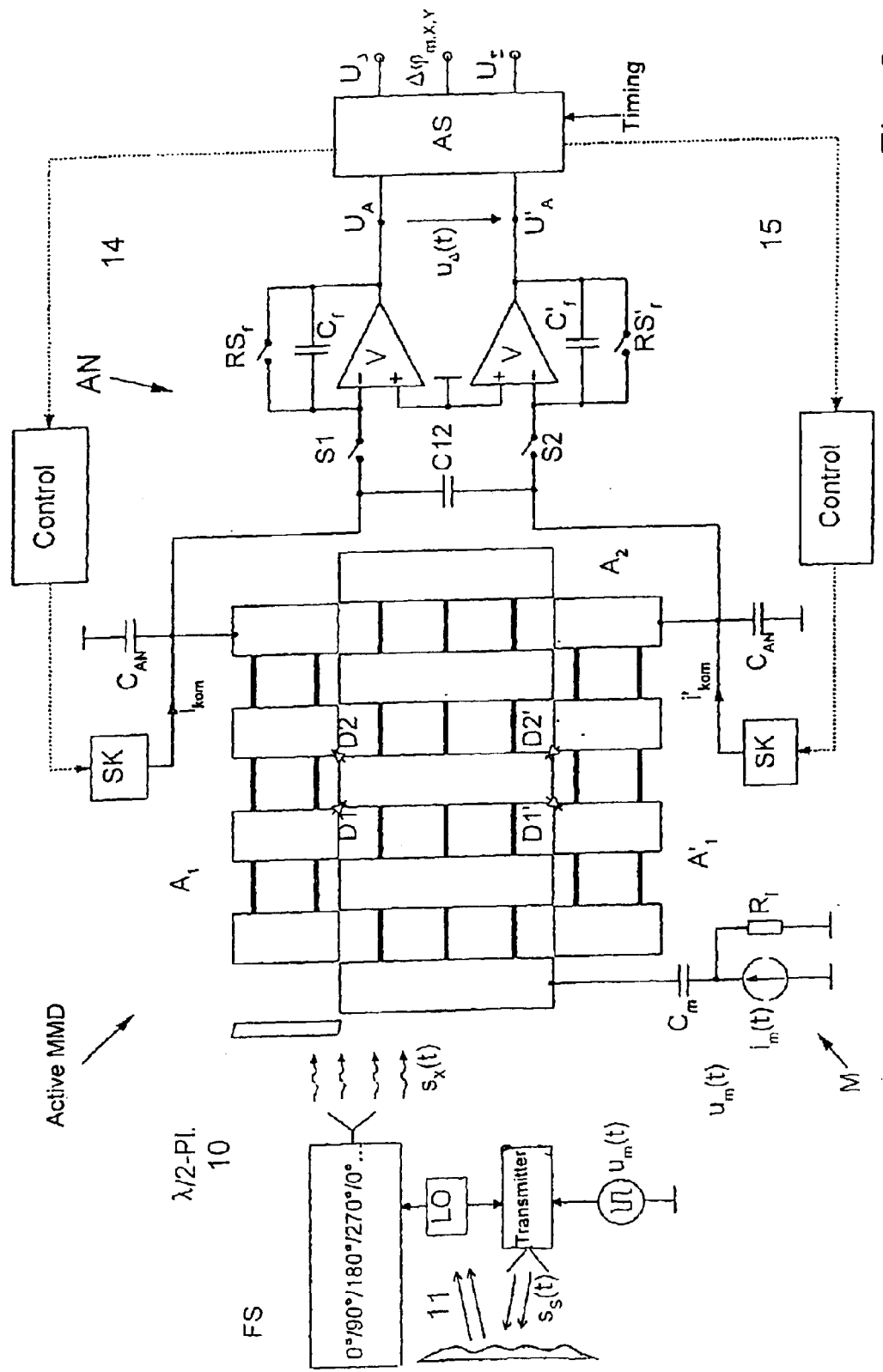

FIG. 9 an active MMD with an asymmetrically modulated and read-out patch antenna structure with a mix amplification with a double-constructed push-pull mixer for compensation of the modulation signals at the output.

FIG. 1 shows a symmetrical SM-PMD (SSM-PMD), which is represented concretely in Schottky/MSM (Metal Semiconductor Metal) technology. In this case the two types of electrode multiply switched in parallel, e.g. anode or cathode, are steered into a symmetrical arrangement preferably via capacitances Cm of the coupling network KN1 and KN2 with a push-pull modulation signal ±um(t) of the modulation source M. The incident signal wave 11, here an optical signal Popt (t), enters between the readout electrodes, here metal electrodes as anodes of the Schottky transitions to the photosensitive semiconductor material 3, into the same (3), and generates photo-holes and photoelectrons. Depending on the phase/polarity of the modulation signal of the electrode types A1/A2, these are also read out by same. The relatively high modulation voltages ±um(t) are introduced into this symmetrical circuit arrangement via coupling networks KN1 and KN3 with the same electrodes, with which the mixing/correlation signals, which are several orders of magnitude smaller, are also read out via the readout networks AN1 and AN2, and via a downstream evaluation circuit AS, in order to be subsequently evaluated, especially with respect to the phase and duration difference between the modulation of the signal wave 11 and the mixing and/or modulation signal um(t). This necessary connection represents a serious readout problem, which limits the possible uses.

The readout network AN separates, according to the invention, the modulation signal and the readout signal, not via a spectrally separating network, e.g. not via a low-pass, but via a scanning readout network AN in connection with the evaluation circuit AS, which can be steered via the terminal 9. After a suitable integration duration of the mixing and correlation process, preferably with the modulation being switched off, this briefly reads out the antisymmetrical charges stored until then in the coupling capacitances Cm, and preferably conducts them to a differential amplifier input of the evaluation circuit AS, directly after which the circuit involved in the readout process is preferably reset with a reset circuit to an electrical ground state for the next measurement period.

The necessary scanning and reset-control procedures are preferably carried out by a central system control unit SST as shown in FIG. 7 and preferably for many PMD pixels in parallel. The advantageous scanning readout process means, among other things, that the frequency range of the modulation signal is in principle not limited by the cutoff frequency of the low-pass, which must, for adequate signal separation, lie several orders of magnitude below that of the modulation signal.

The avoidance of the low-pass is moreover of great economic significance for the possibility of integration, with respect to semiconductor technology, of the readout network together with the evaluation circuit, as the necessary large resistance values and capacitance values and their necessary pixel surface cannot in practice be economically integrated as system-on-chip. In addition the noise of the high resistances is avoided.

In the case of asymmetrical SM-PMD (ASM-PMD), the one electrode type e.g. A1 in FIG. 2 is actively modulated on one side only, while the other electrode type A2, which is opposite in each case, is only passively involved in the modulation process via a low-resistance readout network AN in connection with the evaluation circuit AS, which at the same time means that the charges resulting from the mixing process can be read out largely undisturbed by the modulation signal. The low capacitive crosstalk of the modulation signal of A1 on the readout electrodes A2 can be further reduced by a compensation circuit with capacitive coupling of the inverse modulation signal on A2. FIG. 2 shows, using the example of an ASM-PMD structure in Schottky technology, a possible device for carrying out the process. The readout network AN can in this case preferably consist of a capacitance against earth, usually effective anyway as scattering capacity, and of a transimpedance amplifier, with a resettable capacitance Cf or a parallel RC circuit in the feedback branch of an inverting amplifier.

A particular advantage of this PMD version is the possibility of aperiodic mixing and correlating, not limited to low frequencies in the bandwidth.

Common to both processes is the high selectivity and sensitivity in the evaluation of the sought correlated signal proportion in the signal wave 11 and the high level of suppression of non-correlated signal proportions such as noise and background radiation: common-mode charges on both readout electrodes $A_1'$, $A_2'$ in FIG. 1 are suppressed by the subsequent differential formation of the evaluation circuit according to the frequency separation of the modulation/scanning process.

In the case of the SSM-PMD the correlated signal proportions according to the desired correlation between the modulated signal wave and the push-pull modulation signal automatically give rise to push-pull currents/charges with a differential according to the autocorrelation function.

In the case of the ASM-PMD with a bipolar modulation signal $u_m(t)$ connected on one side at $A_1'$, the non-correlated signal proportions on the readout electrode $A_2'$ give rise in the centre to equally large positive and negative currents and cancel each other out in the integration process. The correlated signal proportions on the other hand, according to the desired correlation between signal wave and modulation signal, automatically give rise to a directional current and/or after the integration a charge/voltage $U_A$ according to the autocorrelation function.

The mixing and correlation principle carried out in Schottky diode technology, using the example of FIGS. 1 and 2, in both self-modulation variants can also be realized in other technologies, in order advantageously to satisfy special requirements of the problem set.

If, e.g. no high switching speeds are required, no Schottky diodes are necessary. Instead of these, PN junctions are then used for A1 and A2 in FIGS. 1 and 2 according to the invention, as shown in FIG. 3 e.g. by corresponding cathode strips. This is explained using as an example the SSM-PMD, here designated PN/ME-PMD, whereby an additional improvement is introduced. In this case the metal shields for the readout cathodes/anodes which are anyway necessary to avoid the undesired dark current during illumination, are at the same time involved in the modulation process. For this purpose according to FIG. 3 the cathode strip K1/K2 is covered by a metal electrode ME1/ME2 against incident light interference. At the same time the modulation signals are capacitively coupled via Ck both to the cathode strips K1, K2, and to the metal electrodes ME1, ME2. The average potential of K1 and K2 is selected somewhat higher than the average potential $U_{ME}$ in FIG. 3 of ME1 and ME2, in order to accelerate the readout process for the photoelectrons. The remaining circuit parts essentially correspond to those of FIGS. 1 and 2.

A practically important difference between the Schottky diode and the PN diode version is the influence of the substrate/backing electrode.

In the first case, with Schottky contact strips, there is practically no influence on the high-resistance p or n epitaxial layer (3) and an isolation layer could also be added over the substrate in FIG. 1. Then both electrons and holes contribute to the mixing process.

In the case of the SM-PMD version with PN diodes, both possibilities exist: 1. The substrate can be isolated and the modulated polarity reversal of the PN diode strips leads to the change of direction of the photocurrent of holes and electrons. 2. The holes are, as represented in FIG. 3, collected by the anode A, negatively biased with UA, and do not contribute to the mixing process. Higher switching speeds are achieved in this way.

The PN/ME-PMD in FIG. 3 is constructed double, in order to carry out two measurements of the correlation in parallel, the inphase (I) measurement on the left, and the quadrature (Q) measurement on the right. From the I and Q values, the differential phase of the signal wave 11 and the modulation signal $U_m(t)$ can be directly determined.

In a further design of the invention, of the above version, in FIG. 4 the cathode strips K1 and K2 are additionally surrounded, in the case of suitable biases, with an intense-field zone, in order to achieve a photocurrent amplification through the avalanche effect. To achieve fields which are as uniform as possible, the anode shape can be cylindrically adapted to the cathode strip.

In FIG. 5 a version of the invention is represented, which can carry out the mixing and correlation process both on the top side and on the underside of the photosensitive material 3 in parallel. This "double PMD" in FIG. 5, due to the opposite anodes and cathodes, has the structure of at least two and preferably a number of PIN diodes arranged in parallel, which can preferably be operated in two different modes.

1. The opposite PMDs are modulated independently, i.e. with two different, preferably push-pull modulation signals, whereby the mixing process, carried out e.g. as SMM-PMD, carries out a double push-pull mixing. The two mixing processes do not influence each other, if both push-pull modulation signals are orthogonal. In spite of a lack of signal orthogonality, they also do not influence each other if the arrangement of the opposite electrodes is orthogonal, as shown in the embodiment in FIG. 5. In this case, according to the invention, the same signal wave can be measured in multiplex operation e.g. with respect to two codings, such as, e.g. often required in the case of IQ measurements with CW modulation or in the case of discriminator AKF measurements with PN coding.

An increase in quantum efficiency can be achieved by mirror-plating the top side of the carrier material (substrate).

A spectral separation of different irradiated light signals can be achieved in that, on the side facing the light, the e.g. mainly blue light signal with typically low absorption length close to the surface generates the "blue" photocharge, whilst e.g. the mainly red light signal with typically longer absorption length penetrates deeper and preferably supported by a reflection layer, generates the "red" photocharge, mainly on the side of the semiconductor structure facing away from the light.

2. This double-PMD structure is particularly advantageous in a version as MSM-PMD structure. Starting from the Schottky/MSM structure described with reference to FIGS. 1 and 2, the cathode strips K1 and K2 above, and the anode strips A3 and A4 below in FIG. 5 are replaced by metal strips on the n substrate and could independently, but preferably in the cooperation described above, be operated in particular in orthogonal geometry and orthogonal modulation, with very high time resolution in parallel, e.g. for reference and aim.

A further PMD version of the process according to the invention is carried out on the basis of a vacuum PMD. A photocathode with a potential of e.g. Uk=−100 volts receives the signal wave. This signal wave is converted into a corresponding signal wave of photoelectrons PEL in the vacuum. Parallel anode strips A1$a$ and A2$a$ are symmetrically modulated in such a vacuum photodiode and could read out the photocurrent generated by a photocathode layer K via the two electrode types A1$a$ and A2$a$ in this anode level a according to the invention via a readout network $AN_{1,2}$. This expense is only justified if a high amplification can additionally be achieved. This is achieved according to FIG. 6 by a Micro Channel Plate MCP with a front end metallized in corresponding strips instead of the anode strips, which modulate the allocation of the photoelectrons to the two electrode types as hitherto in the push-pull via $u_m(t)$. After this mixing process the photoelectrons PEL are multiplied strip-wise e.g. 1000-fold by the secondary electron effect in the microchannels of the MCP and read out by the two anode strip types A1$b$ and A2$b$ on the reverse side of the MCP in the second anode level b via A1$b$ and A2$b$. This MCP photonic mixer device MCP-PMD, besides high amplification, also has a high bandwidth of over 1 GHz due to very rapid channel allocation of the electrons before the microchannels, the fundamental mixing process.

The readout of the amplified photoelectrons occurs either directly via a pixel structure with charge readout adapted in pairs to the modulating anode strip, or additionally with a following subsequently accelerated and direct readout in the form of pixels or electrooptically via a phosphor layer with optical PMD readout, e.g. according to FIG. 1 or FIG. 2.

The above mixing and correlation principle according to the invention is carried out above only with reference to the examples of electromagnetic signal waves above approximately 15 THz, in which the pair formation can technically be used by energy-rich photons. According to the invention it can also be extended to microwaves.

For microwaves below approximately 10 THz this photoelectric effect is not available. Then access to the signal wave is possible, preferably via the antenna currents induced by the displacement currents on the antenna surface. The mixing and correlation principle according to the invention is then also applicable to microwaves via a suitable version of the PMD charge oscillator, and is hereafter referred to, instead of Photonic Mixer Device (PMD) for microwaves, as Microwave Mixer Device (MMD). For the sought-after solution for preferably very high, hitherto not revealed frequency ranges, patch antennae are preferably suitable, which in a finger structure make available the energy from a cross-section of the MMD pixel diameter which is relatively large vis-à-vis the wavelength, the signal wave energy via the wavelength-coherent coupling of the fingers to only one readout contact pair for a suitable charge oscillator. A possible version of this charge oscillator is that, both in the SSM-PMD and in the ASM-PMD e.g. the anti-serial photodiode structure of FIG. 1$a$ is replaced by a single antiparallel circuit of two diodes, preferably Schottky diodes, and in this way an SSM-MMD/ASM-MMD is formed. In this way the push-pull antenna signal of the whole structure of the patch antenna is buffered, and e.g. preferably capacitively coupled to the terminals of the diodes D1 and D2 in FIG. 7, which shows a corresponding device as a block diagram with the SSM (symmetrical self modulating) MMD.

For use of the process according to the invention for microwaves, the signal wave is first converted by the antenna in FIG. 7 into an antenna current, which due to the wavelength-coherent connections of the finger structure for the relatively low frequency range of the modulation signal in question, is available at the terminals of D1 and D2. To detect the phase and amplitude of the signal wave, a push-pull rectifying circuit of Schottky diodes is preferably used, in the simplest symmetrical case a pair of antiparallel Schottky diodes $D_1$ and $D_2$ at a preferably symmetrical antenna output of many individual antenna elements. The modulation signal $u_m(t)$ is in the simplest case and without conversion gain a square wave signal of e.g. a few MHz, a modulation frequency, which is adequate for distance measurements accurate within the cm range. It switches the microwave carrier of the signal source SQ on and off via the wire 13. For the demodulation of this MMD charge oscillator the corresponding modulation signal is carried out as push-pull square wave voltage $+u_m(t)$ via coupling networks $KN_{m1}$ and $KN_{m2}$, preferably as coupling capacitances $C_m$ and preferably in series with an inductivity $L_m$ matched to the frequencies for inductive decoupling of the microwaves, laid symmetrically onto the diode pair. The input signal wave $s_s(t-\tau)$ delayed by an unknown duration $\tau$ or phase $\phi_m$ will thus, depending on the phase position of the diode bias, cause a rectifying current through the diode $D_1$ or $D_2$, and charge the two coupling capacitances $C_m$. With 90° phase shift, for reasons of symmetry the same rectifying current flows into one direction and the other, so that the summation current results in an integration charge of zero. With 0° phase shift, a maximum rectifying current flows in the one direction, with 180° phase shift in the other direction. The associated correlation function AKF over the duration has the known triangular form with square-wave modulation. The current readout of the antisymmetrical charges of the coupling capacitances $C_m$ takes place via the readout network AN, preferably carried out as a scanning circuit with reset, and via evaluation circuit AS. It takes place with integration times that are so short, and at such low resistance, that the integrated charge voltage on the coupling capacitances and corresponding reverse currents via the diodes are negligible. The non-correlated background radiation, for reasons of symmetry, leads to charges on the coupling capacitances $C_m$, which compensate for each other, and is in this way automatically controlled for rectifiable symmetry faults e.g by a control device and current compensation SK as represented in FIG. 9, and suppressed.

The receiving apparatus moreover consists of the antenna, preferably of an image-forming Fresnel microwave lens, or a parabolic mirror lens for at least one, preferably of an array of MMD elements, preferably constructed as an image pixel array of patch antennae, further of the readout network AN, the evaluation circuit AS, the system control SST, the transmitter SQ fed with the carrier frequency $f_T$ from the local oscillator LO, which is modulated via the phase control (phase delay) and the lead wire 13 with $u_m(t)$. It includes, according to FIGS. 7 and 9 with the active MMD a device for conversion gain, preferably with a continuously scanned phase stage FS for generation of a frequency displacement and with the coupling network KNx for the mixed signal $\pm s_x=(t)$ preferably derived from the local oscillator LO, which is transferred to at least one diode pair. While carrying out measurements in the case of passive MMD without conversion gain e.g. in the OOK (ON-OFF Keying) mode, the active mode e.g. allows measurements in the BPS (BI Phase shift) keying mode, but also a number of other usual modulation types. The direct mixed results sa and sb of an MMD array and derived from this, the AKF, phase and amplitude values of the signal wave are preferably fed to a subsequent image evaluation.

To determine a static duration without conversion gain, the situation of the correlation function AKF($\tau$) and/or KKF($\tau$)=U$\Delta$($\tau$) is preferably determined via 4 phase measurements. For this purpose the modulation signal of the MMD mixing device is delayed in four stages $\phi_{md}$=0°/90°/180° and 270° or $$t_d = \frac{Tm}{4} / \frac{Tm}{2} / \frac{3Tm}{4}.$$

The duration is $\tau$=0.25 Tm($\Delta$lm/($\Delta$Re+$\Delta$lm)) with $\Delta$lm=U$\Delta$(90°)−U$\Delta$(270°) and $\Delta$Re=U$\Delta$(0°)−U$\Delta$(180°).

FIG. 8 shows in simplified form an embodiment of the MMD mixing and correlation principle for a pixel of a passive MMD radar unit, i.e. for a passive MMD pixel without conversion gain with an asymmetrical modulation and readout, i.e. a passive ASM-MMD.

The coded signal wave 11=$s_E(t)$ impinges on the patch antenna finger structure in the frequency range of e.g. 10–1000 GHz. The width of the fingers A1 and A2, tuned to resonance, amounts to $\lambda$/2 or an uneven multiple thereof. The length is practically arbitrary and could, in the case of desired polarization independence, also be constructed quadratically. The modulation signal $u_m(t)$ of the modulation source M lies over $C_m$ on the finger structure A1. Here a relatively high internal resistance of the modulation source M is preferably preferred, which is indicated by the equivalent circuit from $i_m(t)$ and the internal resistance $R_i$. The mixing and correlation principle is here also based on the modulated charge oscillator, in this case on the modulated conductivity of the at least two Schottky diodes D1 and D2.

The crosstalk of the modulation signal on the input of the readout network AN is compensated for by the capacitance $C_{AN}$ and a current compensation circuit SK and the current $i_{kom}$, which can preferably be regulated via the evaluation circuit AS to minimal crosstalk.

The non-correlated proportions of the signal wave, due to the mixing process, with this asymmetrical self-modulation (ASM-MMD) in turn result in an alternating current at the input to the readout network AN, which is integrated to zero, whilst the correlated proportions result in a directional current, which is integrated to the autocorrelation function AKF and is evaluated via the evaluation circuit AS with respect to the AKF values, phases and durations $\phi_{m,x,y}=\omega\tau_{m,x,y}$ and the amplitudes. An array of MMD pixels in this way provides a 3D microwave image via x, y.

A use of the process according to the invention on microwave signals with conversion gain is represented in FIG. 9, which is designated "active MMD", again constructed as an asymmetrical MMD. The push-pull patch antenna approximately corresponds to a doubling of that of the passive MMD in FIG. 8, the middle finger structures $A_2$, $A_1'$ being connected in FIG. 9. In addition to the signal wave 11, a mixed signal $s_x(t)$, which is preferably not modulated, impinges in the same polarization on the lower, and in reverse polarization (180° phase shift) on the upper, finger structure. This purpose is served e.g. by the $\lambda$/2 plate 10 in FIG. 9. With inphase heterodyning of the reception signal $s_E(t)$ and mixed signal $s_x(t)$ the MMD sensitivity is considerably increased.

The united finger structures A2 are modulated with relatively high resistance via the modulation source M, as in FIG. 8.

The mixed result appears as a push-pull signal at the A1 and A1' fingers and is read out via the readout network AN preferably with a scanned, doubled Miller integrator, wherein the earth connection of the plus inputs are dispensed with and can advantageously be replaced by a high-resistance bridge to the minus inputs. The upper and lower modulation signal lies with the same polarity at the AN inputs and theoretically leads to no modulation for $U_A(t)$ on the output side. Unavoidable asymmetries and overmodulations are achieved by two measures as well as constant temperature and symmetry of the components and voltages:

1. In calibration measurements, those of the current compensation circuit SK are adjusted via at least one control, so that the fault signals at the outputs $A_1$, $A_1'$ are minimized. The compensation currents $i_{kom}$ and $i_{kom}'$ contain a direct proportion and an alternating proportion compensating for the influence of the modulation signal.

2. The scanning readout circuit preferably uses integration times which are adjusted approximately in inverse proportion to the signal amplitude. During the readout process, the modulation is preferably interrupted.

To determine the sought phase situation of the AKF e.g. of a reflecting object, in the absence of movement and Doppler displacement of objects, a suitable frequency displacement of the mixed signal frequency vis-à-vis the transmitted signal frequency is preferably produced, as previously described with respect to phase step FS. The continuous switching of the phases above the Shannon rate by the discrete phase shift unit FS with a frequency displacement leads to the duration scanning of the AKF, and thus to distance determination via the image depth.

The PMD solutions and structures according to the invention described above have in particular the advantages enumerated below, vis-à-vis the state of the art:

1. The optical attenuation of the light signal by the modulating photogate of the known PMD structures is dispensed with completely. The additionally modulated metal electrodes ME at the same time form the required light protection for the readout electrodes and can, as metal electrodes, transfer the highest modulation frequencies.

2. The finger-type metal and semiconductor structures of the SSM-PMD according to the invention with scanning readout and of the ASM-PMD with decoupled readout is essentially simpler, can be highly integrated, is highly sensitive, essentially enables extended bandwidths for modulation and useful signals and requires fewer process steps for production compared with the state of the art.

3. As between the electrodes modulated in opposite directions (e.g. $A_1$, $A_2$ and $ME_1$, $ME_2$) no further interfering structures are required, the electrode gaps and thus the photocharge durations are decisively reduced.

4. The modulation field takes effect directly in the direction of the desired photocharge transport. This results in more effective use of the modulation voltage with the effect of increasing the drift speed and correspondingly higher modulation bandwidth, or with the possibility of essentially reducing the modulation performance.

5. The blocking voltage of the photodiodes in the PN/ME-PMD essentially supports the charge transport for greater penetration depths of the light signal, as it is adjustable until the saturation field strength is reached, and up to the required expansion of the space charge zone, and so essentially accelerates the charge transport from the depth of the photosensitive semiconductor material. This means that bandwidths can be achieved, which correspond to those of usual PIN photodiodes. In this way the PN/ME-PMD according to the invention is also suitable for long absorption lengths.

6. The photodiode structure of the Schottky PMD is particularly advantageous for small penetration depths/absorption lengths of the signal wave. In the case of absorption lengths in the 1–10 $\mu$m range and in the case of a strip structure with e.g. a lattice constant of 5–10 $\mu$m and electrode widths of 1–5 $\mu$m, modulation bandwidths of several GHz are expected.

7. The planar strip structure, in various technologies and semiconductor materials, can be flexibly adjusted to the PMD requirements laid down, via the strip width and respective finger length almost independently of the pixel size.

8. For the spectral range of approx. 4 . . . 7 $\mu$m and 8 . . . 12 $\mu$m e.g. with relatively high quantum yield and sufficient rapidity, a PN/ME-PMD cooled according to the invention in InSb (indium-antimonide) and in HgCdTe technology, and thus a 3D camera for the highest frequencies which is correspondingly optically safe, can be realized, which partially penetrates mist.

9. Where the measurement of, in particular, two-dimensional thermal images without duration measurement is concerned, a PMD camera according to the invention can serve as a virtually cooled 2D camera (PMD cooled thermal camera), in that the incoming thermal signal wave is modulated via a shutter before the PMD irradiation, the PMD pixel array being modulated with the same modulation signal, however with relatively small modulation frequencies, as no durations are measured. In this way the inherent noise and the dark current of the PMD thermal camera is reduced by orders of magnitude, so that the usual cooling can be dispensed with. The same principle also applies according to the invention for corresponding 2D microwave cameras for unknown microwave signals 11.

10. The PN/ME-PMD structure described is advantageously suitable for a version with load carrier multiplication (avalanche effect) due to an intense-field zone and, as APD-PMD, achieves 10–100 fold higher sensitivities via photocurrent amplification.

11. The proposed process and the advantages of the PMD components and uses based on this relate to a number of progressive uses, e.g.

Phase locked loops (PLL) and CDMA (Code Division Multiple Access) receiver

Three-dimensionally measuring and digitalizing photo and video camera and as electronic 3D robot eye and 3D distance radar Combined opto-microwave-3D camera systems for driver assistance and accident avoidance, combined with an inertial system for improved 3D image processing, further combined with GPS for auto-pilot functions 3D-PMD camera as optical SAR (Synthetic Aperture Radar) interferometer 2D-PMD camera of low modulation frequency without duration measurement but with high background light suppression to mention only a few applications.

What is claimed is:

1. Process for detecting and processing the amplitude and phase of signal waves, wherein a signal source generates a modulated signal wave which, optionally modified by reflection and/or scattering, is received by a receiving apparatus and directly demodulated therein, using a modulation signal, which has a well-defined relationship to the modulation of the signal wave, is directly demodulated by a modulation device without the carrier of the signal wave, and is optionally also detected and evaluated with respect to the amplitude of the modulated signal wave and the phase relationship of the modulation phase of the signal wave and of the modulation signal, wherein in a sensor in a receiving apparatus, sensitive to the signal wave, wave energy particles directly or indirectly generated by means of the signal wave energy, in an oscillation process with a wave energy oscillator matching the modulation signal, are fed to at least two distinguishable receiving electrodes of the sensor, detected, optionally amplified, and transmitted to at least one readout output of a readout unit corresponding to the receiving electrodes in the form of a summation and/or correlation signal, characterized in that, as readout electrodes, groups of parallelswitched receiving elements (A1, A2) or (K1, K2) are used, wherein at least one of the groups of receiving elements (e.g. A1 or A2) is directly loaded with a modulation signal and the output signal is received at least on one group of receiving elements.

2. Process according to claim 1, characterized in that at least two groups of receiving elements in each case form an interlocking finger structure.

3. Process according to one of claims 1 or 2, characterized in that a broad-band modulation signal is used with a bandwidth which lies in a range between DC and microwave frequency.

4. Process according to one of claims 1 to 2, characterized in that the output signal is received at a group of receiving elements not loaded with the modulation signal.

5. Process according to one of claims 1 to 2, characterized in that the receiving elements for high modulation frequencies are operated in multiply parallel-switched strip/finger form and form a provided sensor surface/PMD pixel by a corresponding number and corresponding part-lengths of such receiving elements.

6. Process according to one of claims 1 to 2, characterized in that a number of the PMD pixels form a PMD pixel array, wherein the PMD pixels are each read out individually via output networks AN and readout circuits AS, and preferably in each case loaded with the same modulation signal.

7. Process according to one of claims 1 to 2, characterized in that both groups of receiving elements are loaded anti-symmetrically in push-pull with the modulation signal.

8. Process according to one of claims 1 to 2, characterized in that the separation of the modulation signal and the readout signal takes place via a scanning readout network, consisting of AN and AS.

9. Process according to claim 4, characterized in that only one of the groups of receiving elements is directly loaded with the modulation signal, wherein the current flowing between the two groups of receiving elements is directly, or in the form of accumulating charge, indirectly read out and subsequently evaluated against another non-modulated group of receiving elements.

10. Process according to claim 4, characterized in that the readout of the non-modulated group of receiving elements takes place via a low-resistance readout network, preferably under capacitive and compensating addition of the inverse modulation signal.

11. Process according to one of claims 1 2, characterized in that the receiving elements e.g. A1 and A2/K1 and K2 are operated, due to an fairly narrow version with minimal scattering capacity and minimal dark current and in that for the compensation and amplification of the modulation effect the receiving elements in each case are covered by a number of wider, isolated, preferably metal shielding electrodes ME1 and ME2, which are loaded group-wise with the same or preferably, with respect to the amplitude, somewhat smaller modulation signals.

12. Process according to one of claims 1 to 2, characterized in that the wave energy particles generated by the modulated signal wave, such as e.g. photoelectrons or photo holes are amplified by multiplication, e.g. by the avalanche effect in a semiconductor material or by secondary electron multiplication in a vacuum.

13. Process according to one of claims 1 to 2, characterized in that, in the symmetrical modulation and readout structure, for the avoidance of crosstalk, the modulation frequency is clearly distinguished from the carrier frequency of a coherent or incoherent signal wave, and preferably by at least a factor of 100.

14. Process according to one of claims 1 to 2, characterized in that by means of the output voltages UΔ of the readout circuit of at least one PMD pixel the difference between modulation signal phase and signal wave phase is determined and used for measurement of transmission or echo propagation times of signal waves in free or guided propagation.

15. Process according to one of claims 1 to 2, characterized in that at least two groups of patch antennae, which are each connected in a wavelength-coherent manner with each other, and wherein the at least two groups are connected via at least one antiparallel diode pair, receive a signal wave, wherein the signal wave is rectified by the antiparallel diode pair in time with at least one modulation signal introduced via a coupling capacitance onto a group, and wherein the rectified/mixed signal wave is read out at the at least one other group of patch antennae.

16. Process according to one of claims 1 to 2, characterized in that modulation signals applied to different groups of receiving elements are orthogonal to each other.

17. Device for detecting and processing the amplitude and phase of signal waves, with a signal source which generates a modulated signal wave, a receiving apparatus for the signal wave optionally modified by reflection and/or scattering, a modulation device of the receiving apparatus, which is loaded with a modulation signal, which has a well-defined relationship to the modulation of the signal wave, a sensor of the receiving apparatus, sensitive to the signal waves, in which wave energy particles are directly or indirectly generated by means of the signal wave energy, wherein the modulation device is designed to feed the wave energy particles in an oscillation process with a wave energy oscillator matching the modulation signal, to at least two receiving electrodes of the sensor, and with at least one corresponding readout output of a readout unit for the transmission of a summation and/or correlation signal, characterized in that, the receiving electrodes each consist of a group of parallel-switched receiving elements (A1, A2) or (K1, K2), which have an interlocking finger structure, wherein at least one of the groups of receiving elements e.g. A1 has a direct broadband connection with the modulation device M.

18. Device according to claim 17, characterized in that the receiving elements are constructed in strip/finger form, and are contacted in groups, wherein the receiving elements with or without the shielding electrodes ME supporting the modulation preferably have a narrower width than the also strip-shaped interspaces sensitive to signal wave 11 or the secondary wave energy particles released before it.

19. Device according to claim 17 or 18, characterized in that at least two groups of receiving elements are provided, which are each connected with one of two push-pull modulated terminals of the modulation device.

20. Device according to claim 19, characterized in that for both groups of receiving elements, a shared scanning readout network is provided, which preferably reads out the charges of the respective group of receiving elements, temporarily stored on the parasitic and discrete earth and coupling capacitances Cm, via a differential amplifier which is preferably constructed as a differential Miller integrator.

21. Device according to one of claims 17 to 18, characterized in that a scanning readout network is provided only for one group of receiving elements, which is adequately decoupled via corresponding design of the output network AN from the high-frequency proportion of the modulation signal.

22. Device according to one of claims 17 to 18, characterized in that two groups of receiving elements are provided, only one of which is connected with the modulation device M, wherein the other group of receiving elements is connected with a scanning readout network, preferably constructed as a Miller integrator.

23. Device according to one of claims 17 to 18, characterized in that, to compensate for a capacitive crosstalk of the modulation signal on the non-modulated group of receiving elements a capacitive compensation circuit of the inverse modulation signal on this group is provided.

24. Device according to one of claims 17 to 18, characterized in that the sensors are semiconductors sensitive to electromagnetic waves (photo semiconductors).

25. Device according to one of claims 17 to 18, characterized in that the receiving elements are connected with electron multipliers, or have avalanche semiconductor elements.

26. Device according to one of claims 17 to 18, characterized in that the signal source is a modulatable source of electromagnetic radiation, which within a preferably narrow spectral range emits modulated electromagnetic waves from the spectrum of the radio wave range.

27. Device according to claim 26, characterized in that patch antennae are provided as receiving elements for microwaves, whose outputs are rectified via diode pairs and connected with coupling capacitors.

28. Device according to one of claims 17 to 18, characterized in that the structures of adjacent groups of receiving elements are formed orthogonally to each other.

29. Use of a device according to one of claims 17 to 18 as a PMD-cooled thermal camera, in which sensors sensitive to thermal radiation are used and the radiation of a heat source is modulated by interruption, wherein the groups of receiving elements are modulated with the modulation frequency of the interruption.

30. Use of a device according to one of claims 17 to 18 as an optoelectronic mixing element in a phase locked loop.

31. Use of a device according to one of claims 17 to 18 as a 2D camera suppressing background light.

\* \* \* \* \*